(12) United States Patent
Liu et al.

(10) Patent No.: US 11,864,351 B2
(45) Date of Patent: Jan. 2, 2024

(54) HEAT DISSIPATION STRUCTURE USING HEAT PIPE

(71) Applicant: COOLER MASTER CO., LTD., Taipei (TW)

(72) Inventors: Ting Liu, Taipei (TW); Xiao-Yao Li, Taipei (TW); Yu-Ka Feng, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 2 days.

(21) Appl. No.: 17/709,709

(22) Filed: Mar. 31, 2022

(65) Prior Publication Data
US 2023/0127452 A1 Apr. 27, 2023

(30) Foreign Application Priority Data
Oct. 27, 2021 (CN) .......................... 202111253921.5

(51) Int. Cl.
*H05K 7/20* (2006.01)
*F28D 15/04* (2006.01)

(52) U.S. Cl.
CPC ......... *H05K 7/20336* (2013.01); *F28D 15/04* (2013.01); *H05K 7/2039* (2013.01)

(58) Field of Classification Search
CPC .... H01R 13/533; H04B 1/06; H05K 7/20336; H05K 7/2039; F28D 15/04
See application file for complete search history.

(56) References Cited

U.S. PATENT DOCUMENTS

| | | | |
|---|---|---|---|
| 9,910,231 B2 * | 3/2018 | Kelty | G02B 6/4269 |
| 10,551,580 B2 * | 2/2020 | Regnier | G02B 6/3879 |
| 10,555,437 B2 * | 2/2020 | Little | G02B 6/428 |
| 11,297,734 B2 * | 4/2022 | Lin | H04B 10/25 |
| 2016/0197424 A1 * | 7/2016 | L'Esperance | G02B 6/4269 |
| | | | 439/61 |
| 2018/0277986 A1 * | 9/2018 | Eckel | H01R 13/055 |
| 2020/0136302 A1 * | 4/2020 | Yang | H05K 7/20336 |

* cited by examiner

*Primary Examiner* — Gordon A Jones

(57) ABSTRACT

A heat dissipation structure has a heat dissipation base and at least one heat conduction assembly mounted in a through hole of the heat dissipation base. Each of the at least one heat conduction assembly includes a resilient clamp and a heat pipe. When a transceiver is inserted in the through hole of the heat dissipation base, two heat conducting sections of the heat pipe are pushed by the resilient clamp to abut against the transceiver and the heat dissipation base respectively. Heat generated while the transceiver is operating can be quickly and efficiently conducted through the heat pipe to the heat dissipation base and then dissipated. Temperature increase of the transceiver can be effectively avoided and performance and reliability of the transceiver during operation can be ensured.

10 Claims, 5 Drawing Sheets

HEAT DISSIPATION STRUCTURE USING HEAT PIPE

BACKGROUND OF THE INVENTION

1. Field of the Invention

The present invention relates to a heat dissipation structure, especially to a heat dissipation structure that conduct and dissipate heat with at least one heat pipe.

2. Description of the Prior Art(s)

The main function of a transceiver is to convert optical signals to electrical signals and vice versa, and is a key component in the field of optical communication. Laser diode or light emitting diode is packaged in the transceiver to transmit the optical signals. Photodiode is also packaged in the transceiver to receiver the optical signals and convert the optical signals to electrical signals.

The laser diode, the light emitting diode and the photodiode generate a lot of heat during operation. If the heat cannot be efficiently dissipated, performance and reliability of the transceiver would be seriously affected and the transceiver may even be damaged due to overheating.

To overcome the shortcomings, the present invention provides a heat dissipation structure using heat pipe to mitigate or obviate the aforementioned problems.

SUMMARY OF THE INVENTION

The main objective of the present invention is to provide a heat dissipation structure that has a heat dissipation base having a through hole and at least one heat conduction assembly mounted in the through hole of the heat dissipation base. Each of the at least one heat conduction assembly includes a resilient clamp and a heat pipe.

The resilient clamp has a main body, two resilient pressing plates, and a mounting hole. One of the resilient pressing plates protrudes frontward from a front side surface of the main body and the other resilient pressing plate protrudes rearward from a rear side surface of the main body. The mounting hole is formed through the main body.

The heat pipe has two heat conducting sections and a connecting section formed between the two heat conducting sections and mounted in the mounting hole of the resilient clamp. One of the heat conducting sections protrudes frontward out from the front side surface of the main body of the resilient clamp and is placed over the outer side surface of a corresponding one of the resilient pressing plates. The other heat conducting section protrudes rearward out from the rear side surface of the main body of the resilient clamp and is placed over the outer side surface of a corresponding one of the resilient pressing plates.

When a transceiver is inserted in the through hole of the heat dissipation base, the two resilient pressing plates of the resilient clamp push the two heat conducting sections of the heat pipe respectively, such that the two heat conducting sections abut against the transceiver and the heat dissipation base respectively. Thus, heat that is generated while the transceiver is operating can be quickly and efficiently conducted through the heat pipe to the heat dissipation base and then dissipated. Therefore, temperature increase of the transceiver can be effectively avoided and performance and reliability of the transceiver during operation can be ensured.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
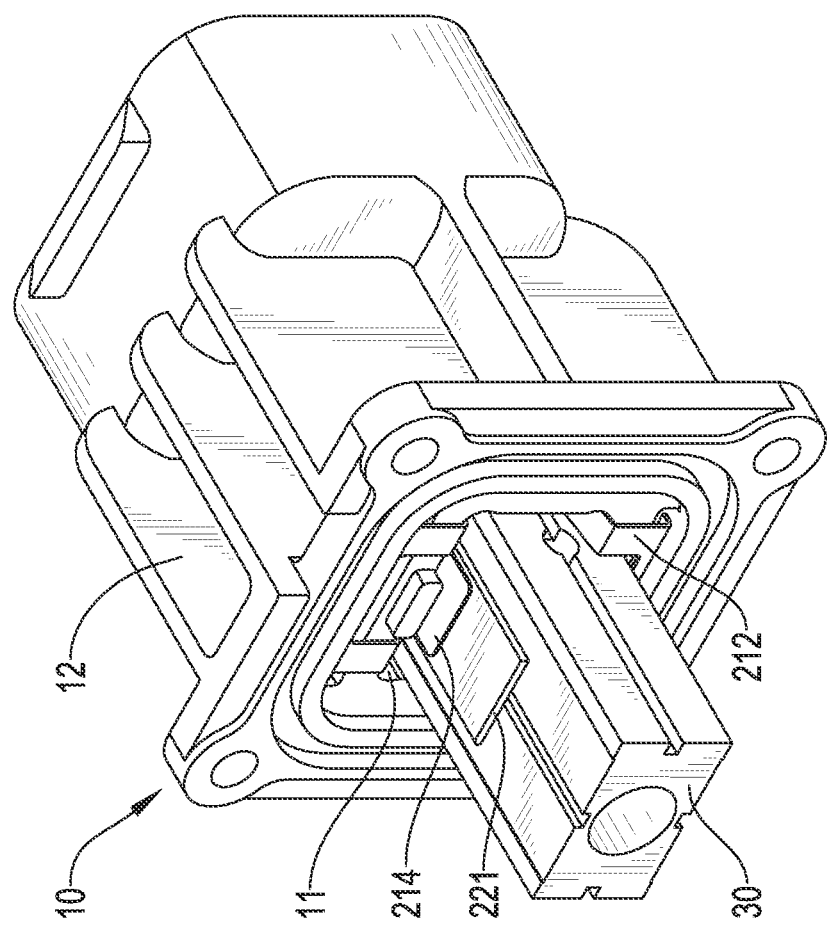
FIG. 1 is an operational perspective view of a heat dissipation structure using heat pipe in accordance with the present invention.
Figure 2:
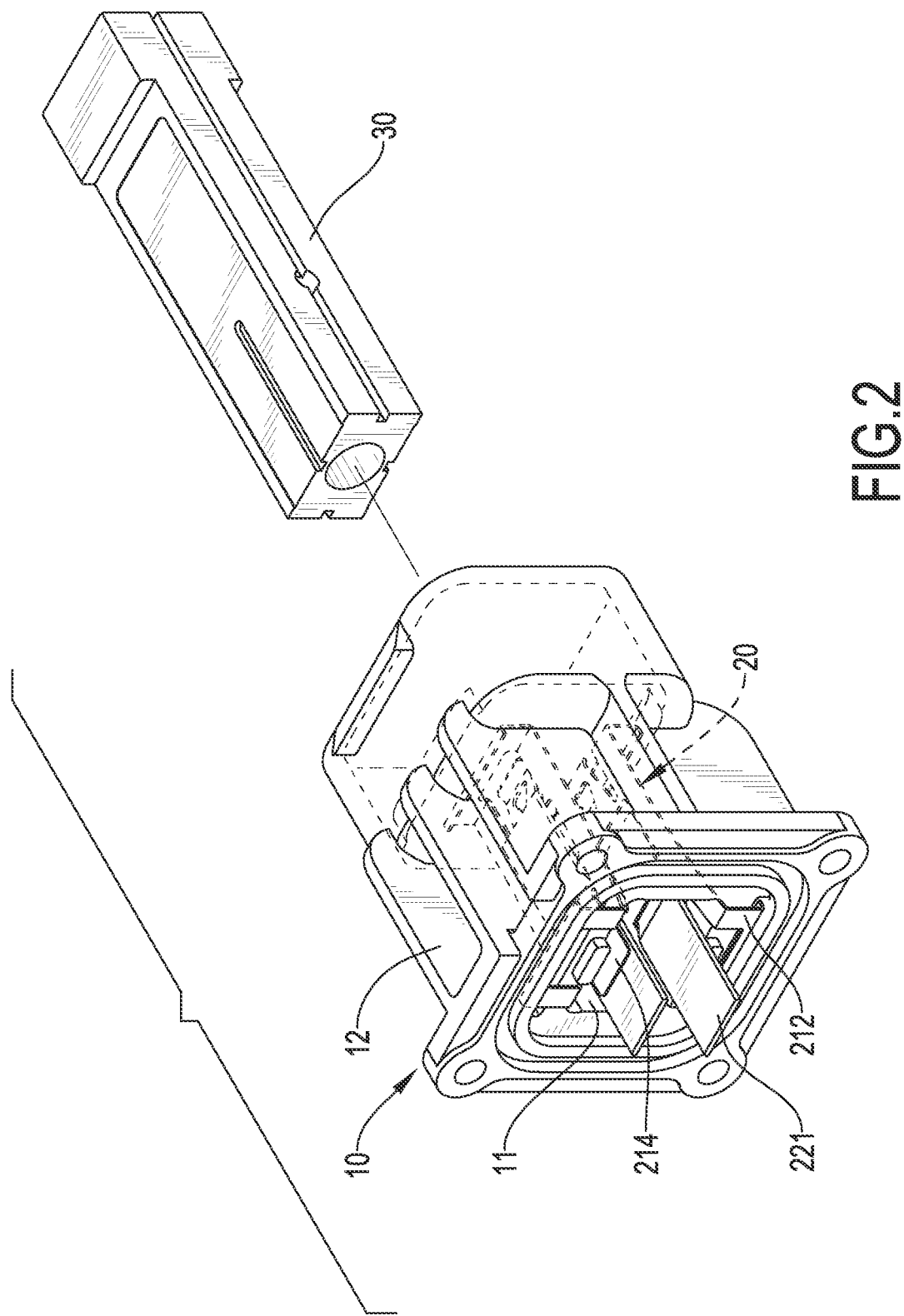
FIG. 2 is an operational exploded perspective view of the heat dissipation structure in FIG. 1.

With reference to FIGS. 1 and 2, a heat dissipation structure in accordance with the present invention is shown. The heat dissipation structure allows a transceiver 30 to be inserted therein, so as to dissipate heat that is generated while the transceiver 30 is operating. The heat dissipation structure comprises a heat dissipation base 10 and at least one heat conduction assembly 20.

As shown in FIGS. 1 and 2, the heat dissipation base 10 has two ends, a through hole 11, an outer side surface, an inner side surface, and multiple heat dissipating fins 12. The ends of the heat dissipation base 10 are oppositely defined on the heat dissipation base 10. The through hole 11 is formed through the heat dissipation base 10 and extends between the two ends of the heat dissipation base 10. The inner side surface is defined around the through hole 11. The heat dissipating fins 12 are formed on the outer side surface of the heat dissipation base 10 and are helpful in dissipating heat. Preferably, the heat dissipation base 10 may be made of materials with good thermal conductivity, such as aluminum alloy or copper.

Figure 3:
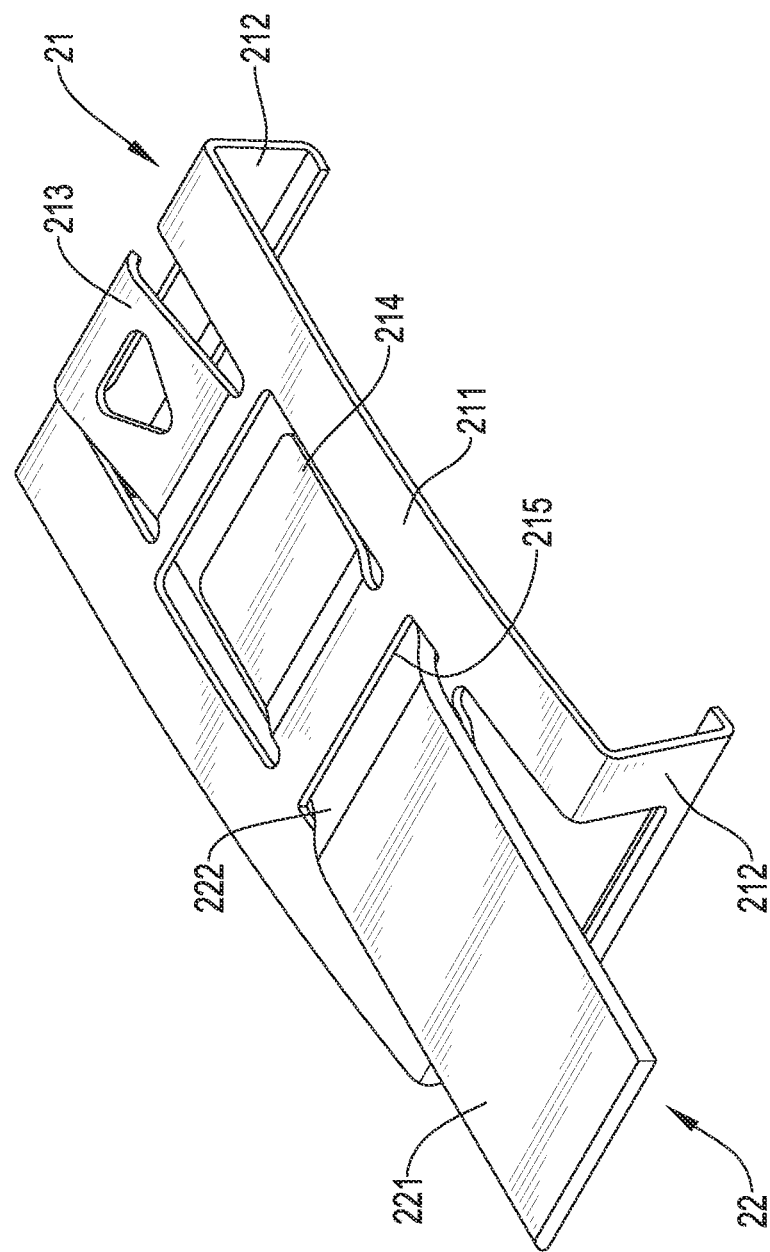
FIG. 3 is a perspective view of a heat conduction assembly of the heat dissipation structure in FIG. 1.
Figure 4:
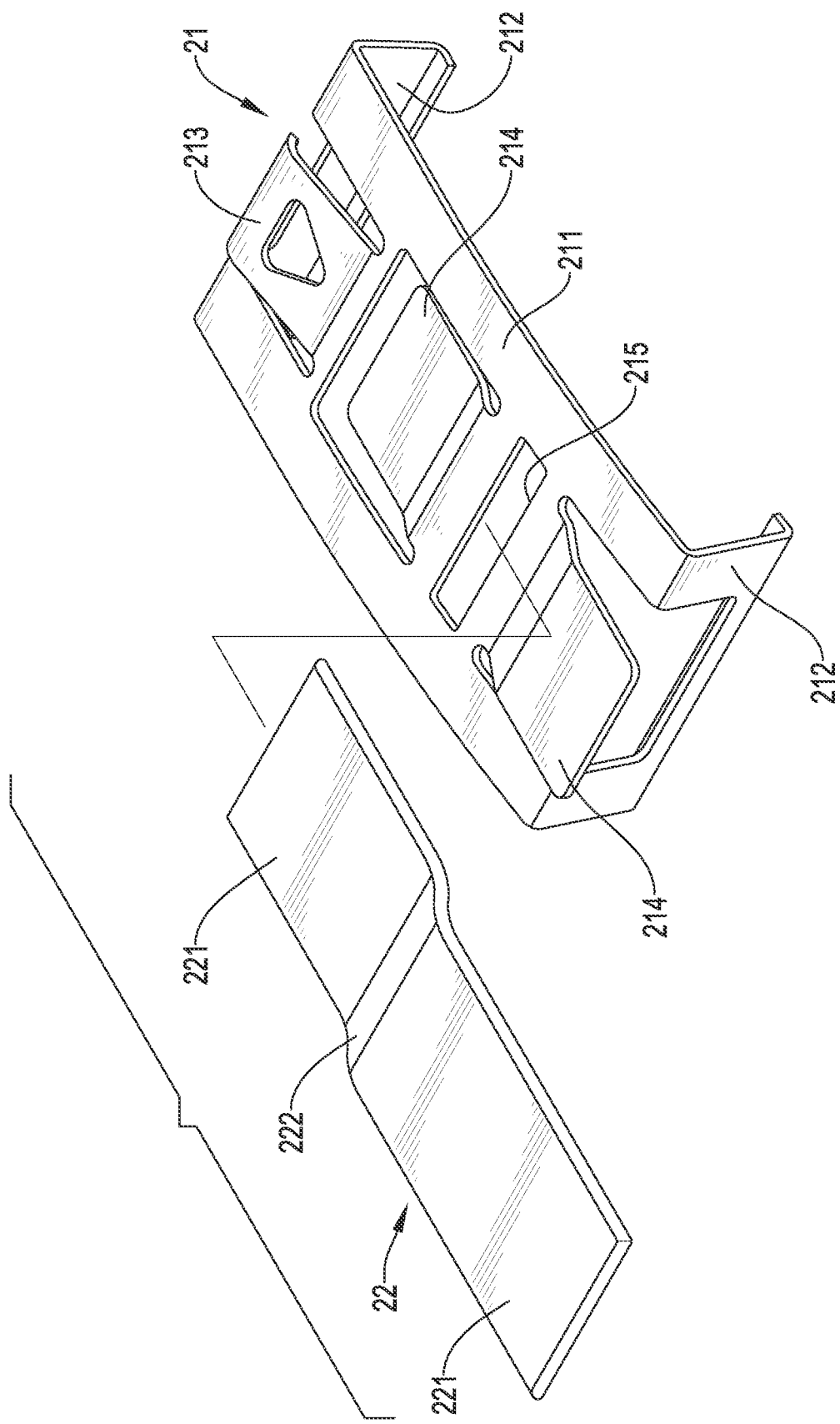
FIG. 4 is an exploded perspective view of the heat conduction assembly of the heat dissipation structure in FIG. 1.

With further reference to FIGS. 2 to 4, the at least one heat conduction assembly 20 is mounted in the through hole 11 of the heat dissipation base 10. Each of the at least one heat conduction assembly 20 includes a resilient clamp 21 and a heat pipe 22.

The resilient clamp 21 is securely mounted on the inner side surface of the heat dissipation base 10 and has a main body 211, two connecting portions 212, a resilient clipping plate 213, two resilient pressing plates 214, and a mounting hole 215.

The main body 211 is disposed apart from the inner side surface of the heat dissipation base 10 and has a front side surface and a rear side surface oppositely defined on the main body 211. When the resilient clamp 21 is securely mounted on the inner side surface of the heat dissipation base 10, the rear side surface faces the inner side surface of the heat dissipation base 10. The two connecting portions 212 are formed on two opposite ends of the main body 211 respectively and are securely connected with the heat dissipation base 10. In the preferred embodiment of the present invention, each of the connecting portions 212 is formed as a hook and is bent toward the rear side surface of the main body 211, such that the two connecting portions 211 are hooked to the heat dissipation base 10. The resilient clipping plate 213 protrudes frontward from the front side surface of the main body 211 and has an end edge connected with the main body 211.

The two resilient pressing plates 214 are disposed between the resilient clipping plate 213 and one of the connecting portions 212. Each of the resilient pressing plates 214 has an end edge connected with the main body 211. One of the resilient pressing plates 214 protrudes frontward from the front side surface of the main body 211 and the other resilient pressing plate 214 protrudes rearward from the rear side surface of the main body 211. Each of the resilient pressing plates 214 has an outer side surface and an inner side surface oppositely defined on the resilient pressing plate 214. The inner side surface of the resilient pressing plate 214 faces the main body 211. The mounting hole 512 is formed through the main body 211.

The heat pipe 22 is formed as an elongated plate and is mounted through the mounting hole 215 of the resilient clamp 21. The heat pipe 22 has two heat conducting sections 221 and a connecting section 222. One of the heat conducting sections 221 protrudes frontward out from the front side surface of the main body 211 of the resilient clamp 21 and is placed over the outer side surface of a corresponding one of the resilient pressing plates 214. The other heat conducting section 221 protrudes rearward out from the rear side surface of the main body 211 of the resilient clamp 21 and is placed over the outer side surface of a corresponding one of the resilient pressing plates 214. The connecting section 222 is formed between the two heat conducting sections 221 and is mounted in the mounting hole 215 of the resilient clamp 21.

In the preferred embodiment of the present invention, the mounting hole 215 is disposed between the two resilient pressing plates 214. Moreover, the connecting section 222 obliquely extends between the two heat conducting sections 221, such that the heat pipe 22 is bent at the connecting section 222 and has a stepped shape. Accordingly, the two heat conducting sections 221 lie in different planes and are able to be placed over the two resilient pressing plates 214 respectively.

In the preferred embodiment of the present invention, the at least one heat conduction assembly 20 includes two heat conduction assemblies 20. The two heat conduction assemblies 20 are oppositely mounted on the inner side surface of the heat dissipation base 10. However, the configuration of the at least one heat conduction assembly 20 is not limited to the form as described above. The at least one heat conduction assembly 20 may include only one heat conduction assembly 20 or include more than two heat conduction assemblies 20. The configuration of the at least one heat conduction assembly 20 depends on the needs for heat-dissipation efficiency.

The above-mentioned heat pipe 22 includes a hollow, vacuum and seal tube made of a material with good thermal conductivity and containing a working fluid. The tube has a capillary structure formed on an inner surface of the tube. The working fluid in liquid phase absorbs heat in an evaporation section of the heat pipe and evaporates into vapor phase, and then the working fluid in vapor phase flows to a condensation section of the heat pipe. The working fluid in vapor phase is cooled and exothermic in the condensation section and is condensed into the liquid phase, and then the working fluid in liquid phase flows back to the evaporation section through the capillary structure. Thus, the heat pipe 22 conducts heat with the working fluid circulating between the liquid phase and the vapor phase in the tube of the heat pipe 22. A specific structure and thermal conduction mechanism of the heat pipe 22 is conventional and will not be described in detail.

Figure 5:
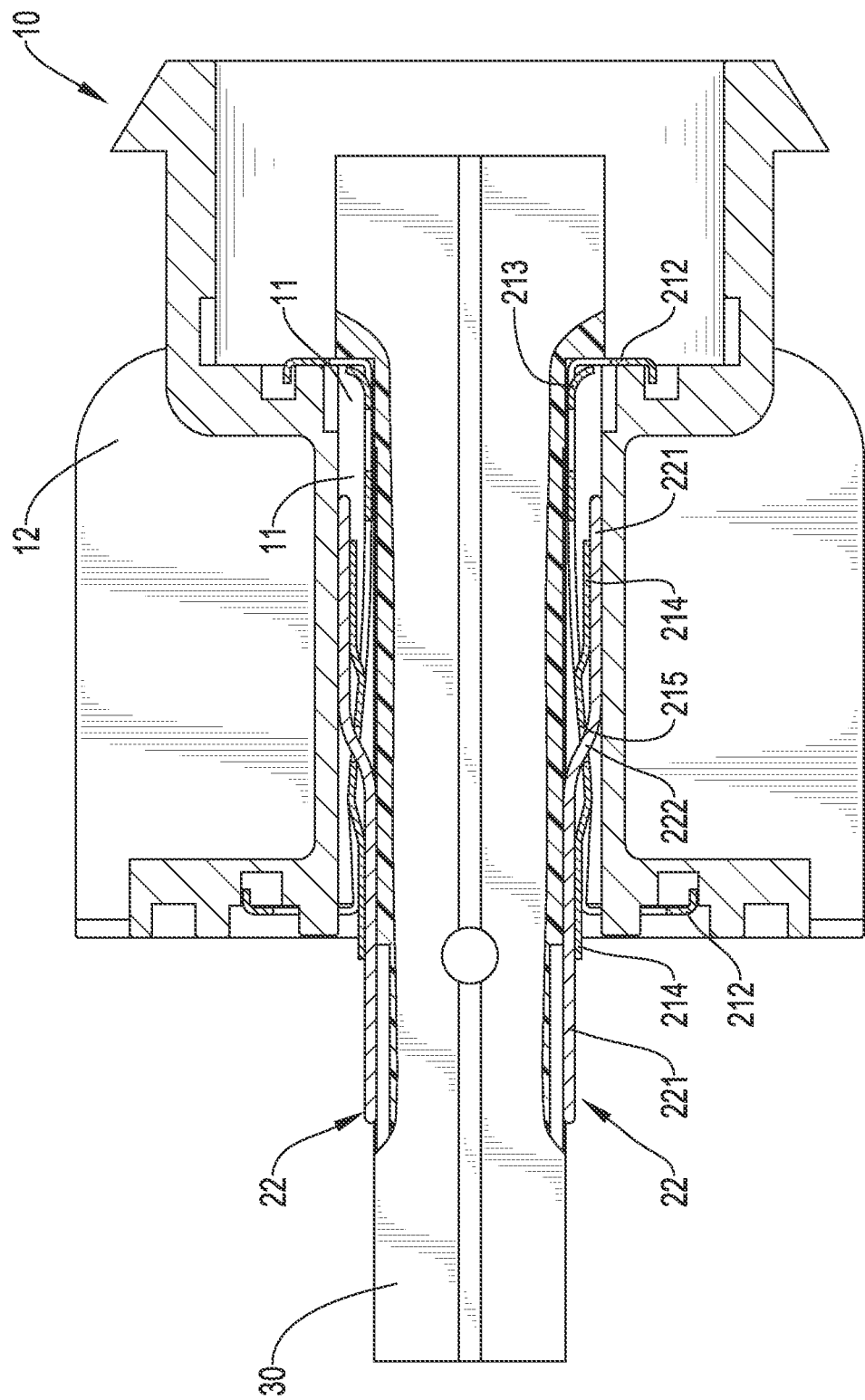
FIG. 5 is an operational cross-sectional side view of the heat dissipation structure in FIG. 1.

With reference to FIGS. 1, 3, and 5, when the transceiver 30 is inserted in the through hole 11 of the heat dissipation base 10, the resilient clipping plate 213 of the resilient clamp 21 abuts against the transceiver 30, so that the transceiver 30 is securely held in the through hole 11. Moreover, the two resilient pressing plates 214 of the resilient clamp 21 push the two heat conducting sections 221 of the heat pipe 22 respectively, such that the two heat conducting sections 221 abut against the transceiver 30 and the inner side surface defined around the through hole 11 of the heat dissipation base 10 respectively.

In this way, the heat that is generated while the transceiver 30 is operating can be quickly and efficiently conducted through the heat pipe 22 to the heat dissipation base 10 and then dissipated. Therefore, temperature increase of the transceiver 30 can be effectively avoided and performance and reliability of the transceiver 30 during operation can be ensured.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat dissipation structure comprising:
   a heat dissipation base having a first end, a second end, and a through hole formed through the heat dissipation base, the through hole extending between the first end and the second end;
   at least one heat conduction assembly mounted in the through hole of the heat dissipation base, each of the at least one heat conduction assembly comprising:
      a resilient clamp having a main body having a front side surface and a rear side surface opposite the front side surface;
      a first resilient pressing plate and a second resilient pressing plate, each resilient pressing plate having an outer side surface, an inner side surface oppositely defined on the resilient pressing plate from the outer side surface, the inner side surface of each resilient pressing plate facing the main body; and an end edge connected with the main body, wherein the first resilient pressing plate protrudes frontward from the front side surface of the main body and the second resilient pressing plate protrudes rearward from the rear side surface of the main body; and
      a mounting hole formed through the main body; and
   a heat pipe formed as an elongated plate, the heat pipe comprising:
      a first heat conducting section protruding frontward out from the front side surface of the main body of the resilient clamp and placed over the outer side surface of the first resilient pressing plate such that the first resilient pressing plate pushes the first heat conducting section to abut against the heat dissipation base; and
      a second heat conducting section protruding rearward out from the rear side surface of the main body of the resilient clamp and placed over the outer side surface of the second resilient pressing plate such that the second resilient pressing plate pushes the second heat conducting section to move into the through hole of the heat dissipation base; and a connecting section formed between the first heat conducting section and the second heat conducting section and mounted in the mounting hole of the resilient clamp.

2. The heat dissipation structure as claimed in claim 1, wherein the resilient clamp of each of the at least one heat conduction assembly further has a resilient clipping plate protruding frontward from the front side surface of the main body and having an end edge connected with the main body.

3. The heat dissipation structure as claimed in claim 1, wherein the resilient clamp of each of the at least one heat conduction assembly further has two connecting portions formed on two opposite ends of the main body respectively and securely connected with the heat dissipation base.

4. The heat dissipation structure as claimed in claim 2, wherein the resilient clamp of each of the at least one heat conduction assembly further has two connecting portions formed on two opposite ends of the main body respectively and securely connected with the heat dissipation base.

5. The heat dissipation structure as claimed in claim 3, wherein each of the connecting portions of the resilient clamp is formed as a hook, is bent toward the rear side surface of the main body and are hooked to the heat dissipation base.

6. The heat dissipation structure as claimed in claim 4, wherein each of the connecting portions of the resilient clamp is formed as a hook, is bent toward the rear side surface of the main body and are hooked to the heat dissipation base.

7. The heat dissipation structure as claimed in claim 1, wherein the heat dissipation base further has multiple heat dissipating fins formed on the outer side surface of the heat dissipation base.

8. The heat dissipation structure as claimed in claim 2, wherein the heat dissipation base further has multiple heat dissipating fins formed on the outer side surface of the heat dissipation base.

9. The heat dissipation structure as claimed in claim 3, wherein the heat dissipation base further has multiple heat dissipating fins formed on the outer side surface of the heat dissipation base.

10. The heat dissipation structure as claimed in claim 4, wherein the heat dissipation base further has multiple heat dissipating fins formed on the outer side surface of the heat dissipation base.

* * * * *